June 21, 1966 O. DAUTE 3,257,578
TELEVISION CIRCUIT FOR GENERATING A SAW TOOTH WAVE
Filed July 21, 1961
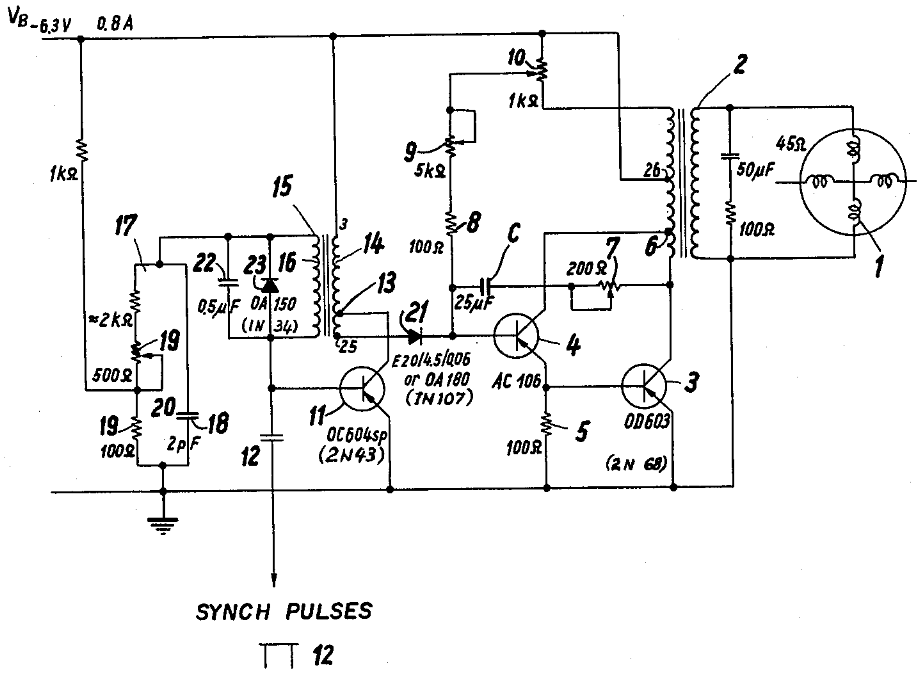
INVENTOR
Otto Daute
BY George H. Spencer
ATTORNEY United States Patent Office 3,257,578

Patented June 21, 1966

3,257,578

TELEVISION CIRCUIT FOR GENERATING A SAW TOOTH WAVE

Otto Daute, Ulm (Danube), Germany, assignor to Telefunken Patentverwertungs-G.m.b.H., Ulm (Danube), Germany Filed July 21, 1961, Ser. No. 125,866
Claims priority, application Germany, July 21, 1960, T 18,730
5 Claims. (Cl. 315—27)

The present invention relates generally to a cathode ray tube (CRT) circuit for generating a saw tooth shaped current, and more particularly to a circuit for generating such a current in a vertical deflection coil or in an ohmic or substantially ohmic resistance, which coil or resistance is fed by an amplifier. The saw tooth current is provided by charging a capacitor in the control circuit of the amplifier through a resistance and by periodically discharging the capacitor through a switch controlled by synchronous pulses.

In the past, these vertical deflection circuits have been designed with the switch being a blocking oscillator whereby the capacitor is charged through a resistance in the anode circuit of the blocking oscillator tube. The saw tooth shaped voltage generated in the capacitor was fed to the input of the amplifier through a capacitive coupling. If the vertical deflection coil or the ohmic or substantially ohmic resistance is coupled to the amplifier by a transformer, it is frequently necessary to predistort the control voltage for the amplifier so as to generate a substantially linear saw tooth current in the vertical deflection coil or in the ohmic or substantially ohmic resistance. This is due to the fact that the transformer does not have an infinitely great primary inductance and thus introduces distortions. The predistortion of the control voltage is usually accomplished by a frequency dependent negative feedback circuit. Another known expedient for rendering a saw tooth voltage linear is to connect a capacitor between the output circuit and the input circuit of an amplifier.

The use of capacitive or transformer coupling presents many problems and disadvantages. For example, when capacitive coupling is used, the capacitance must be extremely large to obviate distortion, and capacitors of this type are expensive. Also, great care must be taken to assure that the operating point is independent of the temperature. When transformer coupling is used, the transformers must be large and thus occupy much space. Furthermore, they generate distortions. In addition, a capacitive coupling is required for adjusting the operating point.

With these defects of the prior art in mind, a main object of the present invention is to provide a vertical deflection circuit which eliminates the need for capacitive or transformer coupling.

Another object of the invention is to provide a circuit wherein the saw tooth voltage may be increased with low battery voltage.

These objects and others ancillary thereto are accomplished according to a preferred embodiment of the invention, wherein a circuit is provided for generating a saw tooth shaped current in a vertical deflection coil or in an ohmic or substantially ohmic load resistance fed by an amplifier by charging a capacitor in the control circuit of the amplifier through a resistor and by periodically discharging the capacitor through a switch controlled by synchronous pulses. The invention particularly resides in providing the switch with a synchronized self-oscillating pulse generator circuit, especially a blocking oscillator, the output of which is connected with the capacitor through a diode of such a forward direction that the internal resistance of the diode is very great during the forward sweep and very small during the flyback pulse. Because of this, a capacitive coupling or a transformer coupling is not needed and the saw tooth voltage may be increased with low battery voltage.

Additional objects and advantages of the present invention will become apparent upon consideration of the following description when taken in conjunction with the accompanying drawing in which the sole figure is a circuit diagram of the present invention.

With more particular reference to the drawing, a vertical deflection stage of a television receiver is provided with an amplifier which uses transistors. The vertical deflection coils 1 are connected to the collector of transistor 3 via a transformer 2. In order to obtain the required deflection output, a further transistor 4, acting as a first driver, and aiding second driver transistor 3 of the output circuit, is connected before transistor 3. The emitter resistor 5 of transistor 4 is connected with the base of transistor 3 so that it also acts as base resistor of transistor 3. Thus, the emitter of transistor 4 is directly connected to the base of transistor 3. The collector transistor 4 is connected with a tap 6 of the primary winding of transformer 2 so as to reduce its power loss. This loss is reduced because, with the same collector current, the average collector voltage is lower than if the collector of the driver were connected directly with the negative pole of the battery. At the same time, the collector current of the first or preliminary transistor 4 contributes toward generating the saw tooth current, and therefore increases the efficiency of the circuit.

The base of transistor 4 is connected with the collector of transistor 3 through a capacitor C which, if desired, is connected in series with a preferably variable resistor 7. If only one driver transistor is used, the base of this transistor is connected with its own collector in the same manner. The capacitor C or the series connection C, 7, could also readily be connected between the base and ground. Moreover, the base of transistor 4 is connected with the operating voltage through resistors 8, 9, and 10. Resistor 10 may be connected in series with the primary winding of transformer 2.

The driver stage thus described is controlled by a blocking oscillator circuit including a transistor 11. The base of this transistor is fed synchronous pulses 12' by a separating stage (not shown) via a capacitor 12. The emitter of transistor 11 is directly connected to ground. The collector of this transistor is connected with tapping point 13 of the primary winding 14 of a feedback transformer 15. The secondary winding 16 of transformer 15 is connected at one end to the base of transistor 11 and at the other end to the parallel circuit 17, which is connected to ground and includes a capacitor 18 and one or more resistors 19. A tap 20 of resistance 19 is connected with the negative operating voltage $V_B$ which is −6.3 volts. The primary winding 14 of transformer 15 is connected at one end directly to the operating voltage and at the other end to the base of transistor 4 through a diode 21. Diode 21 is selected so that it will conduct or pass only when transistor 11 is conducting. A parallel circuit including a capacitor 22 and a diode 23 is connected in parallel with secondary winding 16.

The operation of the illustrated circuit will now be described. The values of various components are indicated in the drawing including the German identifications of the semiconductor elements, with an example of a corresponding American identification. In this example, pf.=picofarads ($10^{-12}$ farads).

The blocking oscillator is designed to provide pulses having a duration of about 6% of the forward sweep, that is, of about 1.2 milliseconds, and at a frequency of 50 cycles per second. It is freely oscillating and is synchronized by pulses which, as in tube circuits, may be obtained by integrating the pulse mixture after the separating stage.

The base bias of the blocking oscillator is provided by dividing the battery voltage at a low ohm tap of the frequency determining RC-member. This reduces the effect of the coupling of the blocking oscillator and the output stage through the internal resistance of the power source. The division is chosen to maintain the reliability of initiating operation of the blocking oscillator.

The purpose of the 0.5 $\mu$f. capacitor 22, in parallel with the secondary winding of transformer 15, is to practically short-circuit pulses of line frequency which might get to the blocking oscillator from the deflection unit. This may occur due to the slight coupling of the line coils and the picture tube coils which is always present.

The parallel connection of the capacitor and the inductance of the transformer provides a resonant circuit. Such a circuit would be excited to oscillation, upon completion of a flyback pulse due to the magnetic energy stored by the inductance during the flyback pulse, thereby impairing the mode of operation of the blocking oscillator. Accordingly, diode 23 is connected in parallel to render this oscillation aperiodic, and it then no longer impairs the mode of operation of the circuit.

A diode 21, such as a selenium rectifier (AEG E 20/7, 5/0.06) is employed as the switch element proper and is connected between the collector of the blocking oscillator transistor 11 via a portion of transformer primary 14 and the base of the driver transistor 4.

When there is no current in the blocking oscillator, the negative battery voltage is on the left side of rectifier 21. Therefore, the rectifier is blocked and consequently cannot influence the voltage increase at the base of the driver transistor 4.

When current is flowing in the blocking oscillator transistor 11, there is a positive voltage on the left side of diode 21 which is greater than the positive pole of the battery by about two volts and which is composed of the positive pulse voltage at the transformer tapping point 25 and the negative residual voltage of the collector. The diode is therefore conducting. The presence of this diode makes possible the provision of tap 13 at an appropriate point along the winding and thereby an increased saw tooth voltage.

The use of an output stage with only one driver circuit, as compared to the two stages illustrated in the drawing, would result in a greater consumption of current and would require a greater charging capacitor of about 10,000 $\mu$f. In the short available flyback time, the charging of such a large capacitor is possible only if the circuit element serving as a switch has an extremely small internal resistance. It is difficult to make such elements with extremely small internal resistances. Moreover, the use of large electrolytic capacitors is prohibited because of cost and space limitations.

By providing a preliminary driver stage 4 before the final driver stage, these difficulties are substantially reduced because the greater over-all amplification obtained requires a substantially smaller charging current and thus a substantially smaller charging capacitor. The preliminary driver stage with the transistor 4 is connected with the input of the final driver stage through its emitter resistance 5 which, at the same time, serves to stabilize the temperature of the emitter current. A portion of the primary winding of the output transformer 2 which is between taps 6 and 26 is located in the collector circuit and reduces the energy loss of the driver stage by about one-third.

It will be understood that the above description of the present invention is susceptible to various modifications, changes, and adaptations, and the same are intended to be comprehended within the meaning and range of equivalents of the appended claims.

What is claimed is:

1. A circuit for generating a saw tooth shaped current in a vertical deflection coil, comprising, in combination:
   (a) switch means including a blocking oscillator;
   (b) an amplifier having a control circuit for feeding such vertical deflection coil, and including
      (1) a resistor, and
      (2) capacitor means in the control circuit of the amplifier and charged via said resistor and feeding the coil by periodically discharging through the switch means and controlled by synchronous pulses;
   (c) diode means connecting the output of the blocking oscillator with said capacitor means and arranged to have a very great internal resistance during the forward sweep of the saw tooth wave and a very small internal resistance during flyback; and
   (d) a blocking oscillator transformer having a primary winding connected between the output of the switch means and a source of operating voltage, a portion of said winding extending beyond the connection of the winding and switch means, and the end of said winding portion being connected to the diode means.

2. A circuit for generating a saw tooth current in a vertical deflection coil, comprising, in combination:
   (a) switch means including a synchronous, self-oscillating pulse generator circuit in the form of a blocking oscillator and diode means controlled thereby;
   (b) transistor amplifier means having an input, an output, and a control circuit for feeding such vertical deflection coil, and an amplifier circuit, and including
      (1) a resistor, and
      (2) capacitor means in the control circuit of the amplifier means and charged via said resistor and periodically discharged via said switch means controlled by synchronous pulses, said diode means being connected so that its internal resistance is very great during the forward sweep of the saw tooth wave and very small during flyback, said diode means being connected to be made conductive by positive pulses from the pulse generating circuit, and being connected at a connection point with the amplifier input, and
      (3) a resistance forming a series circuit with said capacitor means, said series circuit being connected between said connection point and said amplifier output.

3. A circuit as defined in claim 2 wherein said resistance is controllable.

4. A circuit as defined in claim 3 wherein said amplifier circuit includes two galvanically connected transistor stages.

5. A circuit for generating a saw tooth waveform current in a deflection coil, comprising, in combination: an amplifier having a deflection coil connected in its load circuit and having an input electrode and an output electrode; a resistor; a charging capacitor in series with said resistor which is unbypassed and connected from the output electrode to the input electrode; a unilaterally conductive device; a pulse generator having its output connected to said input electrode through said unilaterally conductive device; a source of D.C. voltage; and a discharging resistance connected from said voltage source to said charging capacitor, and said conductive device being arranged to be conductive during a discharging period for said charging capacitor and rendered non-conductive by pulses from said generator to charge said charging capacitor.

References Cited by the Examiner

UNITED STATES PATENTS

| | | | |
|---|---|---|---|
| 2,846,581 | 8/1958 | Volkers | 331—112 |
| 2,926,284 | 2/1960 | Finkelstein et al. | 331—112 X |

(Other references on following page)

UNITED STATES PATENTS

| | | | |
|---|---|---|---|
| 2,939,040 | 5/1960 | Isabeau | 307—88.5 |
| 2,972,066 | 2/1961 | Riley | 331—112 X |
| 3,033,994 | 5/1962 | Fujimoto et al. | 328—66 |
| 3,070,758 | 12/1962 | Janssen et al. | 331—112 X |

OTHER REFERENCES

IBM Technical Disclosure Bulletin: vol. 2, No. 6 "High Speed Saw Tooth Generator," by E. J. Seray, page 111, April 1960.

ARTHUR GAUSS, *Primary Examiner.*

JOHN W. HUCKERT, *Examiner.*

J. JORDAN, *Assistant Examiner.*